United States Patent [19]

Smirnov

[11] 4,232,265
[45] Nov. 4, 1980

[54] DEVICE FOR MEASURING INTENSITY OF MAGNETIC OR ELECTROMAGNETIC FIELDS USING STRAIN GAUGES MOUNTED ON FERROMAGNETIC PLATES

[76] Inventor: Vladimir A. Smirnov, ulitsa Lavochkina, 52, kv. 208, Moscow, U.S.S.R.

[21] Appl. No.: 897,746

[22] Filed: Apr. 17, 1978

[51] Int. Cl.³ .................. G01R 33/02; G01R 19/00
[52] U.S. Cl. .................. 324/260; 324/244; 324/117 R; 33/DIG. 13
[58] Field of Search ............... 324/244, 259, 260, 261, 324/200, 205, 207, 208, 246, 252, 117 R, 127, 129, 167; 338/2; 335/151, 153; 33/DIG. 13; 73/760, 763, 767, 774, 779

[56] References Cited

U.S. PATENT DOCUMENTS

| | | | |
|---|---|---|---|
| 2,316,203 | 4/1943 | Simmons, Jr. | 33/DIG. 13 |
| 2,761,216 | 9/1956 | Gollub | 33/DIG. 13 |
| 3,321,702 | 5/1967 | Tuccinardi | 324/259 |
| 3,397,348 | 8/1968 | Hoeppel | 335/151 |
| 3,801,908 | 4/1974 | Van Andel | 324/117 R |

OTHER PUBLICATIONS

IBM Technical Disclosure Bulletin, vol. 11, No. 8, Jan. 1969, p. 917, R. Taylor, "Current Sensing Device", 324-259.

Primary Examiner—Gerard R. Strecker
Assistant Examiner—Walter E. Snow
Attorney, Agent, or Firm—Steinberg and Blake

[57] ABSTRACT

A device for converting the intensity of a magnetic or an electromagnetic field into an electric signal wherein movable elements are made as ferromagnetic plates rigidly fixed in supports so that their free ends overlap each other. Mounted on the deformation section in the immediate vicinity to the place where the ferromagnetic plate is fixed in its support is an element sensing the displacements of the free ends of the plates with respect to each other. The sensing element is made as at least one resistance strain gauge connected to a measuring circuit.

8 Claims, 9 Drawing Figures

Measuring Circuit

DEVICE FOR MEASURING INTENSITY OF MAGNETIC OR ELECTROMAGNETIC FIELDS USING STRAIN GAUGES MOUNTED ON FERROMAGNETIC PLATES

APPLICATION OF THE INVENTION

The present invention relates to electromechanic transducer devices and in particular to devices for converting a magnetic field intensity into an electric signal designed around magnetically controlled contacts.

BACKGROUND OF THE INVENTION

Known in the art are magnetically controlled contacts made as ferromagnetic plates rigidly fixed in a support and overlapping each other at their free ends which will come closer to one another when the current flowing through a magnetizing coil grows from zero to a certain value and diverge when it continues growing (see, for example, U.S. Pat. No. 3,551,860).

A variation of the magnetic field intensity will result in a change of the gap between the ferromagnetic plates and, consequently, of the intercontact capacitance. The technique based on the use of the intercontact capacitance of the ferromagnetic plates as a parameter specifying the magnitude of a magnetic field intensity suffers from a number of drawbacks caused by the fact that with shifts of the plates the intercontact capacitance will vary in a non-linear way and at a low multiplicity factor. Besides, the absolute values of this capacitance are quite small (from 0.5 to 3.0 pF) and therefore their measurement requires that high frequencies should be used.

One of the known designs that is the closest to the one proposed herein relates to a device for converting a magnetic field intensity into an electric signal which comprises movable elements made as ferromagnetic plates rigidly fixed in supports so that their free ends overlap each other and an element for sensing the relative displacement of the free ends of the ferromagnetic plates, the element being connected to a measuring circuit. The displacement of the free ends of the ferromagnetic plates is measured with the use of photodetector elements, such as a photomultiplier and an illumination lamp, mounted at opposite sides of the gap between the overlapping ends of the ferromagnetic plates. In such devices the magnetic field intensity is converted into a current flowing through a photodetector element.

(See, for instance, Zaretskas V.-S.S., Ragulskene V. L. "Mercury commutator elements for automatic devices". Energia, 1971, p. 51).

However, the use of such devices as a means for converting the intensity of a magnetic field into an electric value requires a stable power supply, a dustless environment and precise adjustment of the ferromagnetic plates with respect to the illuminator-photodetector axis. Negligence to these requirements tends to reduce the reliability of such converters. Besides, their conversion range is limited when the size of ferromagnetic plates is increased.

BRIEF DESCRIPTION OF THE INVENTION

The object of the present invention is to provide a device for converting the intensity of a magnetic field into an electric signal which would have high reliability and a wide conversion range.

The essence of this invention consists in providing a device for converting the intensity of a magnetic or electromagnetic field into an electric signal comprising movable elements made as ferromagnetic plates rigidly fixed in supports so that their free ends overlap each other, and an element sensing the respective displacement of the free ends of the ferromagnetic plates which is connected to a measuring circuit wherein, according to the invention, the sensitive element is made as at least one resistance strain gauge mounted at the deformation section in the immediate vicinity to the point where the ferromagnetic plate is fixed in the support.

Conveniently the magnetic field source is made as a current conduit while the device is provided with an assembly for rotating the axis of the resistance strain gauge with respect to the longitudinal axis of the current conduit, the assembly being rigidly coupled with the supports.

Conveniently also the device is provided with a permanent magnet mounted so that it can be shifted with respect to the ferromagnetic plates in order to vary the resistance rating of the strain gauge the value of which is used as an additional indication of the permanent magnet position.

Preferably, the device should comprise a control magnetizing coil connected, via an amplifier-converter, to an a-c voltage source for periodic variations in the strain gauge resistance.

BRIEF DESCRIPTION OF THE DRAWINGS

The invention will be better understood from the following description of its embodiments given by way of example and shown in the accompanying drawings in which.

DETAILED DESCRIPTION OF THE INVENTION

The proposed device for converting the intensity of a magnetic field into an electric signal comprises movable elements made as ferromagnetic plates 1 (FIG. 1) and 2 rigidly fixed in supports 3 and 4 so that their free ends overlap each other. The device comprises also an element sensing the relative displacement of the free ends of the ferromagnetic plates represented as at least one resistance strain gauge mounted at the deformation section in the immediate vicinity to the point where the ferromagnetic plate is fixed in the support. The embodiment of the invention described herein uses one resistance strain gauge 5 mounted on the ferromagnetic plate 1.

Figure 2:
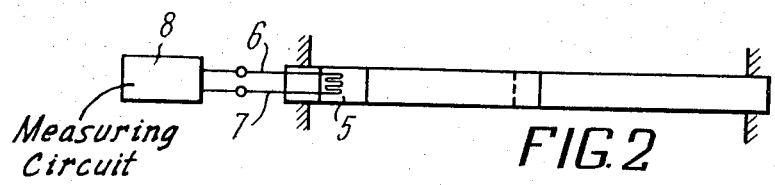
FIG. 2 presents the device as shown in FIG. 1, viewed from above, according to the invention.

Terminals 6, 7 of the resistance strain gauge 5 are connected to a measuring circuit 8 (FIG. 2).

Figure 3:
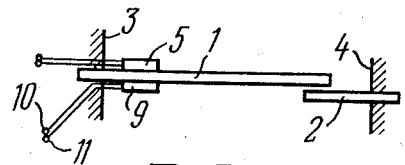
FIG. 3 presents a version of the proposed converter device with two resistance strain gauge according to the invention.

FIG. 3 presents another version of the embodiment of the device for converting the intensity of a magnetic field into an electric signal which, according to the invention, comprises an additional resistance strain gauge 9 having terminals 10 and 11 mounted in a way similar to that of the resistance strain gauge in the immediate vicinity to the point where the ferromagnetic plate 1 is fixed in the support 3 but on the opposite surface of the plate 1.

An additional resistance strain gauge 9 subjected to deformation opposite to that of the resistance strain gauge 5 and located in the immediate vicinity to it makes it possible to raise the magnitude of the useful signal (in the form of resistance increment) and to reduce the temperature-dependent conversion error caused by resistance temperature variations of the strain gauge.

Figure 4:
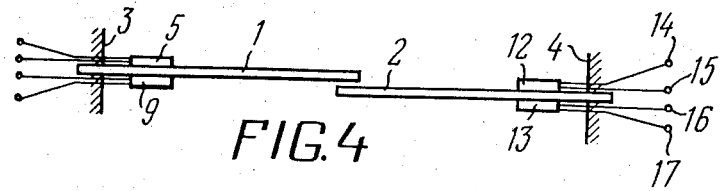
FIG. 4 presents the proposed converter device with four resistance strain gauges according to the invention.

FIG. 4 presents another version of the embodiment of the device for converting the intensity of a magnetic field into an electric signal which, according to the invention, comprises, in addition to those in the version of FIG. 3, still two more resistance strain gauges 12 and 13 having terminals 14, 15, 16, 17 mounted on the ferromagnetic plate 2.

The use of the two more resistance strain gauges 12 and 13 makes it possible to raise the magnitude of the useful signal still further though the displacement of the ferromagnetic plates 1 and 2 is the same.

Figure 5:
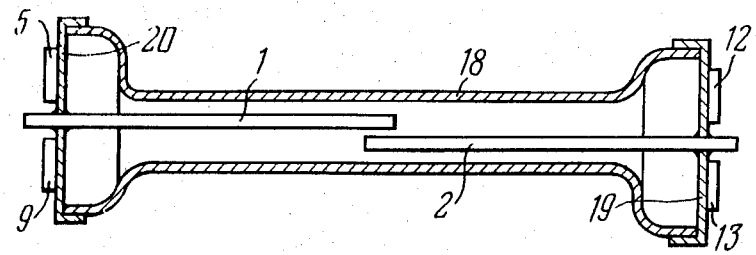
FIG. 5 presents a version of the proposed converter device with four resistance strain gauges installed on membranes which are secured to the body of the device (longitudinal cross section of the body and the membranes) according to the invention.

The device for converting the intensity of a magnetic field into an electric signal proposed herein and shown in FIG. 5 differs from the version presented in FIG. 4 in that it comprises a casing 18 housing the ferromagnetic plates 1 and 2. The casing 18 is made of non-ferromagnetic materials. The butt ends of the casing 18 are provided with broad sections carrying membranes 19 and 20 secured to them. The diameter of these membranes 19, 20 exceeds to a certain extent that of the casing 18 in its central section. The membranes 19 and 20 have their edges rigidly fixed (welded) to the casing 18. Connected rigidly to said membranes 19 and 20 at their centers are the ferromagnetic plates 1 and 2 respectively. The connection may be either sealed or unsealed. In the version of the embodiment described herein the membranes 19 and 20 serve as resilient elements and perform the function of supports for the ferromagnetic plates 1 and 2. Placed at the outer surfaces of the membranes 19 and 20 are the resistance strain gauges 5, 9 and 12, 13 respectively, which are secured to deformation sections in the immediate vicinity to the points where the ferromagnetic plates 1 and 2 are fixed.

The use of the casing 18 and the membranes 19 and 20 which are connected rigidly to it makes it possible, firstly, to place the resistance strain gauges 5, 9, 12, 13 after the major components, including the ferromagnetic plates 1 and 2 have been assembled; secondly, to arrange the resistance strain gauges 5, 9, 12, 13 at the outer surfaces of the membranes 19, 20, which facilitates the connection of other components to the terminals of the resistance strain gauges 5, 9, 12, 13, and thirdly, to increase the number of resistance strain gauges in the system by means of securing them at the deformation sections of the membranes 19, 20. Still another advantage of the version of the embodiment of the proposed invention described herein consists in that its design features allow to automate the procedure of its production.

Figure 6:
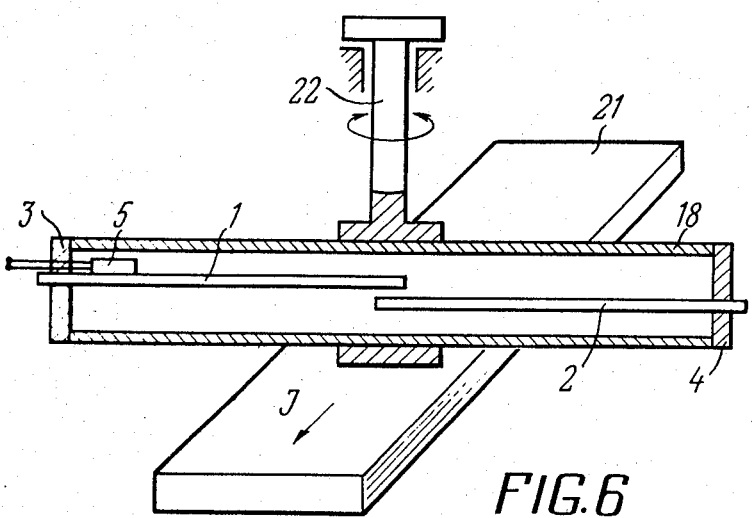
FIG. 6 presents a version of the proposed converter device with a field source made as a current conduit (partial longitudinal cross section) according to the invention.

FIG. 6 presents another version of the device according to the invention wherein the field source is made as a current conduit 21. In addition the device is provided with an assembly 22 for rotating the axis of the resistance strain gauge 5 about the longitudinal axis of the current conduit 21. The assembly 22 is rigidly coupled with the supports 3 and 4 through the casing 18. The supports 3 and 4 are made mainly of an isolation material as washers. The casing 18 is made of non-ferromagnetic materials. In order to increase the accuracy of converting the intensity of a magnetic field into an electric signal the casing 18 is preferably made of copper so as to form a short-circuited winding.

The use of the rotation assembly 22 allows variations to be made in the range and the sensitivity of converting the intensity of a magnetic field generated by the current conduit 21 into an electric signal.

Figure 7:
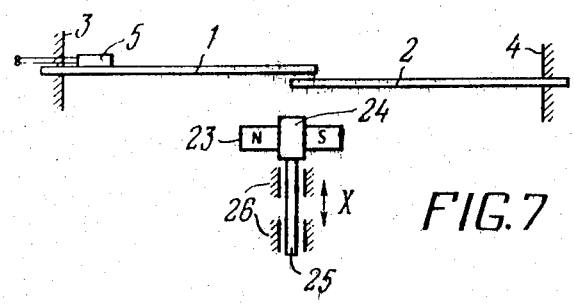
FIG. 7 presents a version of the proposed converter device wherein the field source is made as a permanent magnet according to the invention.

FIG. 7 presents a version of the device according to the invention wherein the field source is made as a permanent magnet 23 which serves as a complementary element of the proposed device. Simultaneously the permanent magnet 23 performs the function of a means for transferring the data on its position, to which end it is mounted so that it can be shifted with respect to the ferromagnetic plates 1 and 2 and hence, vary the resistance of the strain gauge 5. The permanent magnet 23 is shifted with the help of a holder 24 wherein the permanent magnet 23 is fixed and by means of a rod 25 housed in guides 26 and rigidly coupled with the holder.

The directions of the permanent magnet 23 shifts with respect to the longitudinal axes of the ferromagnetic plates 1, 2 as indicated by arrows in FIG. 7 are not the only possible. The present version of the proposed device allows to consider the shift and the position of the permanent magnet 23 in case of its rotation as well as in case of its movement along the ferromagnetic plates 1 and 2.

An index "X" indicates the effect caused by a sensor of the parameter to be measured (not shown in FIG. 7) on the rod 25 which shifts the permanent magnet 23. The functions of the sensor of the parameter to be measured could be performed by a pressure pick-up, a temperature sensor, ect. which converts the parameter to be measured into a displacement. The assembly described above is especially suitable in transferring the results of measurements to a remote user.

One of the possible embodiments of the converter version hereinbefore described is a device for converting angular position of the rod 25 of the permanent magnet 23 into variations of the resistance of the strain gauge 25. Such a converter is used most preferably in cases when the rotation rates of the rod 25 are about zero. The above circumstance is due to the fact that the proposed device for converting the intensity of a magnetic field into an electric signal wherein the functions of a field source are performed by the permanent magnet 23 combines in a most advantageous way both a means allowing to determine the amount of displacement of the permanent magnet and a means presenting the information on the position (coordinate) of the permanent magnet 23. In particular the proposed design makes it possible to reliably and accurately solve the problem of determining the position of slowly rotating rotors in electric machines such as step-by-step motors.

Figure 8:
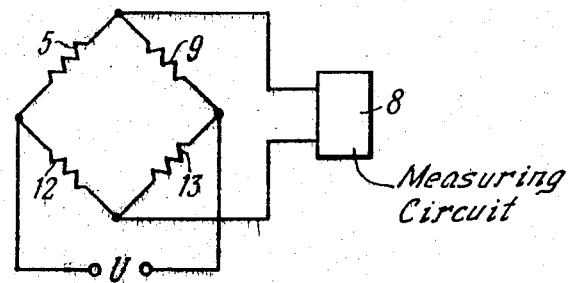
FIG. 8 presents a diagram of connections between resistance strain gauges and the measuring circuit in the proposed converter device according to the invention.

FIG. 8 presents a version of the device according to the invention wherein the resistance strain gauges 5, 9, 12 and 13 are interconnected to one another and to the measuring circuit. Shown in FIG. 8 in particular is the interconnection of said resistance strain gauges 5, 9, 12, 13 into a bridge circuit one diagonal of which is connected to a source of the supply voltage U and the other, to the measuring circuit 8. The above method of interconnecting the resistance strain gauges 5, 9, 12, 13 and the measuring circuit 8 makes it possible to obtain a large electric signal in the form of an output current. This is due to the fact that a variation of the magnetic field intensity will cause a change of the resistance in all the four strain gauges 5, 9, 12, 13. Besides, the error introduced by ambient temperature variations could be reduced drastically by means of selecting resistance strain gauges having similar temperature responses. The above device employing the proposed interconnection circuit could be used to advantage as a remotely variable resistor, the rating of which being varied either by means of changing the current that flows through the control magnetizing coil or by means of shifting the permanent magnet. An additional advantage of the proposed method of interconnecting the resistance strain gauges consists in that it allows to obtain an output in the form of a current signal proportional to the product of the supply voltage "U" by the current "I" which determines the intensity of the magnetic field being converted by the proposed device into an electric signal. In case the supply voltage "U" is set equal to a voltage drop across the ohmic-inductance load having the current "I" flowing through it the output of the circuit will be proportional to the power consumed by the load.

Figure 9:
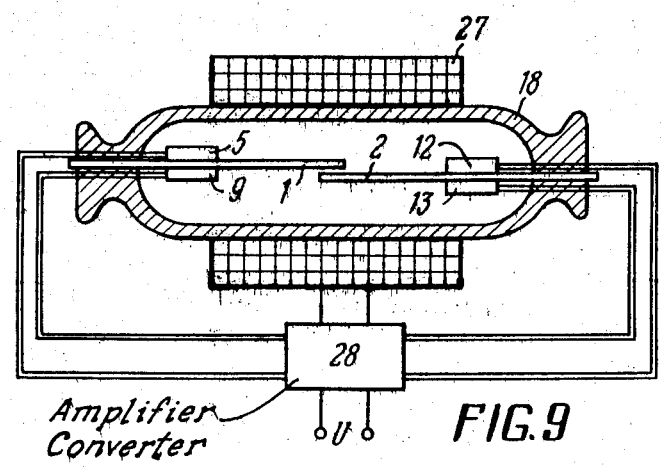
FIG. 9 presents a version of the proposed converter device wherein the resistance strain gauges are connected, via an amplifier-converter, to a magnetizing control coil.

FIG. 9 presents a version of the device for converting the intensity of a magnetic field into an electric signal according to the invention which comprises a control magnetizing coil 27 connected, via an amplifier-converter 28, to the resistance strain gauges 5, 9, 12, 13. This design of the proposed device makes it possible to obtain a feedback loop using the position of the ferromagnetic plates 1 and 2 as the source of a feedback signal which can be either positive or negative, which allows to vary the characteristics of converting the intensity of a magnetic field into an electric signal. In particular the device can operate as a null-indicator. In this case, of course, there is no external voltage supply, i.e. U=0. However, in this case it is required that the electromagnetic field generated by the control magnetizing coil 27 should compensate for the effect of the external magnetic field to be converted into an electric signal. If there are several control magnetizing coils (not shown in FIG. 9) the displacement of the ferromagnetic plates 1 and 2 and their resultant position will be determined by the sum (or difference) effect of the coils.

In another version of the embodiment of FIG. 9, the control magnetizing coil 27 is connected, via the amplifier-converter 28, to an a-c voltage source, designated U, thereby providing for periodic variations in the resistance of the strain gauges 5, 9, 12, 13 and enabling a-c amplifiers to be used for handling signals from the strain gauges.

Thus, it is seen that in the above-described arrangements, the amplifier-converter 28 serves to perform a double function, the first of which is to amplify the signal of the out-of-trim condition of the electric bridge formed by the strain gauges 5, 9, 12 and 13, while the second function is to convert either the amplified signal of the out-of-trim condition (where U=0) or voltage of the alternate voltage source U which supplies the magnetizing coil 27. Therefore, the amplifier-converter 28 comprises a voltage differential amplifier and a power amplifier, serially connected to each other, which operate independently.

The device for converting the intensity of a magnetic or an electromagnetic field into an electric signal shown in FIGS. 1 and 2 operates as follows.

As soon as a control signal in the form of a longitudinal or a transverse magnetic or electromagnetic field is applied to a system of ferromagnetic plates 1 and 2 the latter will start approaching each other and with the further increase of the control signal they will diverge, provided that the initial gap and the amount of overlapping between the ferromagnetic plates 1 and 2 exceed certain limiting values, i.e. the values at which the ferromagnetic plates 1 and 2 still contact each other. In case the above requirements are not met the proposed device will operate within the time interval from the moment the ferromagnetic plates 1 and 2 start approaching each other till the moment when they start moving with a jump to contact each other. In any case, however, the above mutual approach of the ferromagnetic plates 1 and 2 is accompanied by their resilient bending since they are rigidly fixed in the supports 3 and 4. The outer surfaces of the ferromagnetic plates 1 and 2 expand while the inner ones contract. In the particular case of cantilever arrangement of the ferromagnetic plates 1 and 2 the deformation section subjected to the maximum strain will be located in the immediate vicinity to the point where the ferromagnetic plate is fixed in the support 3. It is at this section that the resistance strain gauge should be located. A properly selected and mounted resistance strain gauge will vary its resistance in proportion to the displacement of the free end of the ferromagnetic plate 1. The variations of the resistance of the strain gauge 5 are sensed by the measuring circuit 8 so that its output indicates the intensity of the magnetic or electromagnetic field.

Figure 1:
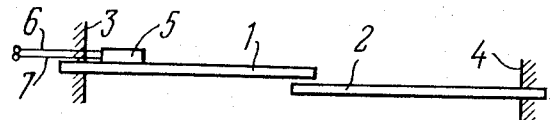
FIG. 1 presents a device for converting the intensity of a magnetic field into an electric signal, the device being provided with one resistance strain gauge, according to the invention.

The operation of the version of the proposed device as shown in FIG. 3 is similar to that of the version presented in FIGS. 1 and 2. However the use of complementary resistance strain gauge 9 makes it possible to compensate for temperature and to raise the level of the useful signal in any of the known ways.

The operation of the device for converting the intensity of a magnetic or electromagnetic field into an electric signal arranged as shown in FIG. 4 is similar to that of the previous version of the device. In order to raise the level of the output still higher and to reduce the error to the minimum it is necessary to select the resistance stain gauges 5, 9, 12 and 13 so that they have similar responses and to install the ferromagnetic plates 1 and 2 symmetrically so as their free ends bend to one and the same extent while the resistances of the strain gauges 5, 13 and 9, 12 are equal.

The operation of the device arranged as shown in FIG. 5 is basically the same as that of the previous version. The fact that the inside of the device is protected with a casing allows to stabilize its response to a certain extent against variations of the amount of dust, gas and other ingredients of the environment. The major difference, however, consists in the use of the deformation suffered by the membranes 19 and 20 performing the functions of resilient elements. The ferromagnetic plates 1 and 2 and the membranes 19, 20 in the device are designed so that the increase of the control signal represented by a longitudinal or transverse magnetic or electromagnetic field will not result in a resilient bending strain of the ferromagnetic plates 1 and 2 that are to approach each other, while the deformation of said membranes will have the form of a waveshape bend. In this case the maximum strain sections in every membrane 19 and 20 will be located at the points where they are fixed in the butt-ends of the casing 18 and in the immediate vicinity to the place where the ferromagnetic plates 1 and 2 are rigidly fixed in the membranes 19 and 20. It is these sections that the resistance strain gauges 5, 9 and 12, 13 are to be located. Properly selected and mounted resistance strain gauges 5, 9, 12, 13 will vary their resistances in proportion to the displacement of the free ends of the ferromagnetic plates 1 and 2.

The operation of the device designed according to the invention as shown in FIG. 6 is basically similar to that of the device versions presented in FIGS. 1 and 2. The only difference however consists in that the control signal represented by a longitudinal magnetic field affecting the system of the ferromagnetic plates 1 and 2 is generated by a direct current flowing through the current conduit 21. The use of copper to make the casing 18 allows to reduce errors caused by exposed variations of the current I. The device will exhibit the maximum sensitivity when the longitudinal axis of the ferromagnetic plates 1, 2 is orthogonal to that of the current conduit 21, and the minimum sensitivity when the above axes are arranged parallel to each other. In case the electromagnetic fields to be converted saturate the ferromagnetic plates 1 and 2 of the device the casing 18 shall be turned into a position where there would be no saturation of the ferromagnetic plates 1 and 2. The above version of the device according to the invention permits to reliably and accurately convert strong direct currents (tens and hundreds of kiloamperes) into electric signals as increments of the resistance ratings of the strain gauge 5.

The operation of the device designed as shown in FIG. 7 is basically similar to that of its version presented in FIGS. 1 and 2. The difference, however, consists in that the control signal represented by a longitudinal (or transverse) magnetic field that affects the system of the ferromagnetic plates 1 and 2 is generated by the permanent magnet 23. The displacement of the permanent magnet 23 will vary the intensity of the magnetic field to be converted by the ferromagnetic plates 1 and 2 and the resistance strain gauge 5 into an electric signal. In case it is required to determine discrete displacements of the permanent magnet 23 when, for instance, the amount of the production is counted piece by piece, the resistance strain gauge 5 will be connected, via an amplifier-converter, to a counter of the discretely varying resistance of the strain gauge 5 (the amplifier-converter and the counter are not shown in the drawing).

The circuit wherein the resistance strain gauges and the measuring circuit are interconnected as shown in FIG. 8 will operate in case the ferromagnetic plates 1 and 2 are being displaced and the resistance ratings of the strain gauges 5, 9 and 12, 13 are changing.

Since the resistance strain gauges 5 and 9 as well as 12 and 13 are subjected to deformation effects caused by the displacement of the ferromagnetic plates 1 and 2, the deformations being of opposite signs, their arrangement in adjacent arms of the bridge will ensure the maximum sensitivity of the circuit with respect to the intensity of the magnetic or electromagnetic field to be converted (the sensitivity of the circuit is the ratio between the relative increment of the current at the output of the bridge to the relative variation of the intensity of the magnetic or electromagnetic field). The initial adjustment of the bridge requires that the resistance strain gauges 5, 9, 12, 13 should be accurately selected. However this adjustment could be facilitated by means of adding a complementary balancing resistor to the circuit of the device (not shown in the drawing).

The operation of the version of the device presented in FIG. 9 as a null-indicator (where $U=0$) depends on the mode of converting the intensity of a magnetic or electromagnetic field into an electric signal.

In this embodiment, as mentioned above, the amplifier-converter 28 consists of a differential amplifier of voltage generated by the electric bridge formed by the strain gauges 5, 9, 12 and 13 when in their out-of-trim condition and of a power amplifier serially connected thereto, which power amplifier feeds the magnetizing coil 27. The feedback signal sent by the magnetizing coil 27 which corresponds to the position of ferromagnetic plates 1 and 2 can be either positive (when the direction of the magnetic flux of the coil 27 coincides with the direction of the magnetic flux of the magnetic field to be converted) or negative (when the magnetic flux of the coil 27 compensates for the action of the exterior magnetic field to be converted). In this embodiment, the input of the amplifier-converter 28, namely, the differential amplifier can, in principle, comprise the measuring circuit 8. Further, this mode can be either continuous or relay-like. In the continuous conversion mode with negative feedback the output of the amplifier-converter 28 is applied to the control magnetizing coil 27 which forces the ferromagnetic plates 1 and 2 to return to their initial positions since the electromagnetic field generated by the control coil 27 will compensate for the effect of the magnetic or electromagnetic field to be converted. This mode of operation of the device ensures high accuracy and sensitivity of the conversion process. In the relay-like conversion mode with negative feedback the output of the amplifier-converter 28 is applied to the control magnetizing coil 27 in a manner similar to that described above. However the shape and the duration of the signal should be different.

The operation of the device discussed herein is intended to obtain a commutation mode that would be free from vibration and ensure the optimum rate of commutation whereat the time required for the ferromagnetic plates 1 and 2 to shift from one stable position into another will be minimal. The proposed mode of the operation of the device is based upon the theory and methods of optimal control and a complement part of them which is known as dynamic programming. These theories and methods are well known having been repeatedly disclosed at IFAG International Congresses Sections 1–5. Thus, "optimal control" theories (see, for example, The Encyclopedia of Modern Technology, The Automation of Production and Industrial Electronics, volume 2) and "dynamic programming" (ibid. volume 1, and Bellman R., Dynamic Programming) are employed to render a system optimal, i.e., where there is no rattling during the closing of the plates 1 and 2 and wherein such closing has a quick action. In order to obtain the above effect the control action represented by the number of ampere-turns should be made as high as possible. The ferromagnetic plates 1 and 2 to be closed are accelerated to the maximum speed and then the control action is dropped in a jump to the zero level. Thus, the ferromagnetic plates 1, 2 are "self-braked" and close at a zero speed. More particularly, the theoretical and practical aspects of this action are set forth in "Optimal Control Over Direct Current Electromechanical Devices", A. G. Butkovsky and A. J. Tcherkashin, Energy, Moscow, 1972. It is there disclosed that in order to determine the time of the variation of the magnitude during such action, the position and the speed of the displacement of the ferromagnetic plates are required to be known. According to the present invention, the position and the speed of displacement of the ferromagnetic plates are determined by the output signal of the electric bridge formed by the strain gauges. Thus, the ferromagnetic plates 1 and 2 are acted upon by the flux produced by a pair of magnetizing coils (one of which is shown in FIG. 9). One coil will generate an extreme value constituting a control action so as to provide for an acceleration of the ferromagnetic plates such that they are closed at a predetermined maximum speed. The other magnetizing coil (coil 27) produces a flux generated by the output signal of the electric bridge deformed by the strain gauges thereby generating a second control action which completely compensates for the effect of the first control action during the time in which the ferromagnetic plates completely close. At this time, the resultant control action will be equal to zero whereby the ferromagnetic plates will be "self-braked". The theories and practices described herein are clearly set forth in the above-mentioned publications. After that the control action is generated again to ensure that the ferromagnetic plates 1 and 2 remain in the closed position. The value of the speed at which the ferromagnetic plates 1, 2 are displaced and their positions are determined with the help of data provided by the resistance strain gauges 5, 9, 12 and 13.

The embodiment in which the control magnetizing coil 27 is connected to an a-c voltage source via the amplifier-converter 28 operates as follows. The amplitude and frequency of the supply a-c voltage are set in such a manner as to provide for forced oscillations of the ferromagnetic plates 1 and 2 as well as periodic variations in the resistance of the strain gauges 5, 9, 12, 13. In the presence of an invariable or slowly variable control action in the form of the magnetic (electromagnetic) field intensity, amplitude modulation of periodically varying resistances of said strain ganges takes place.

Thus, where use is made of an alternating voltage source (U≠0), the amplifier-converter 28 comprises two separate components, the first being a power amplifier which amplifies the signal from the alternate voltage source U which is then inputted to magnetize the coil 27. In this manner, the plates are deflected thereby varying the resistances of strain gauges 5, 9, 12 and 13. The second part of the amplifier-converter 28 is a differential amplifier of the out-of-trim condition of the electric bridge formed by the strain gauges. Thus, as distinct from the previous embodiments of amplifiers, the present amplifier is an alternating current amplifier and, therefore, is free from the various drawbacks which conventional direct current amplifiers have.

What is claimed is:

1. A device for measuring the intensity of a magnetic or electromagnetic field produced by a field source comprising:
   a first elongate flat plate formed of a ferromagnetic material having first and second end portions, said first end portion thereof being rigidly fixed to a first support member so that said first plate extends from said first support member in a cantilevered manner;
   a second elongate flat plate formed of a ferromagnetic material having respective first and second end portions, said first end portion thereof being rigidly fixed to a second support member so that said second plate extends from said second support member in a cantilevered manner, said second end portion of said first plate being located in spaced opposed relationship to said second end portion of said second plate to define a gap therebetween, said first and second plates forming a flux path for said field source;
   at least one of either said first and second plates and first and second support members comprising a deformation section in the region immediately proximate to the respective points at which said first and second plates are rigidly fixed to said first and second support members, respectively, said at least one deformation section being subject to deformation upon deflection of said first and second plates by said magnetic field;
   at least one resistance strain gauge means mounted on a respective one of said deformation sections and said at least one resistance strain gauge means having an axis appropriately aligned on said at least one of either said first and second plates for generating an electrical signal output indicative of the deformation of said deformed section caused by a relative displacement of said second end portions of said first and second plates upon deflection thereof; and
   a measuring circuit coupled to said at least one strain gauge means for measuring the electrical signal output thereof.

2. A device as claimed in claim 1 wherein said field source comprises an elongate current conduit and which device further comprises:
   means rigidly coupled to said first and second support members for rotating the same and for thereby rotating the axis of said resistance strain gauge means with respect to that of said current conduit.

3. A device as claimed in claim 1 wherein said field source comprises a permanent magnet mounted for rotation with respect to said ferromagnetic plates;
   and further including means for displacing said permanent magnet with respect to said ferromagnetic plates whereby upon such displacement the plates will be correspondingly deflected so as to vary the resistance of said resistance strain gauge means, the value of the output signal of which serves as an additional indication of the position of said permanent magnet.

4. A device as claimed in claim 1, further comprising a control magnetizing coil and an AC voltage source, and wherein said measuring circuit includes an amplifier-converter having an output coupled to said control magnetizing coil and an input coupled to said AC voltage source whereby a variation in the magnetic field of said coil effects a corresponding deflection of said plates so as to vary the resistance of said resistance strain gauge means.

5. A device as claimed in claim 1, wherein each of said first and second plates has an inner surface facing in directions toward that of the other and an outer surface facing in directions away from that of the other, and said resistance strain gauge means comprises a single resistance strain gauge on the outer surface of said first plate.

6. A device as claimed in claim 1, wherein each of said first and second plates has an inner surface facing in directions toward that of the other and an outer surface facing in directions away from that of the other, and said resistance strain gauge means comprises a first resistance strain gauge on the outer surface of said first plate and a second resistance strain gauge on the inner surface of said first plate.

7. A device as claimed in claim 1, wherein each of said first and second plates has an inner surface facing in directions toward that of the other and an outer surface facing in directions away from that of the other, and said resistance strain gauge means comprises a first resistance strain gauge on the outer surface of said first plate, a second resistance strain gauge on the inner surface of said first plate, a third resistance strain gauge on the inner surface of said second plate and a fourth resistance strain gauge on the outer surface of said second plate.

8. A device as claimed in claim 7, wherein said first, second, third and fourth resistance strain gauges are electrically connected as the arms of an electric bridge between corresponding ones of four connection points of said bridge, said measuring circuit being electrically connected to two of said connection points, and further comprising a source of supply voltage for energizing said bridge, said source of supply voltage being electrically connected to the other two of said connection points.

* * * * *